Nov. 20, 1962 V. J. LYONS 3,065,113
COMPOUND SEMICONDUCTOR MATERIAL CONTROL
Filed June 30, 1959
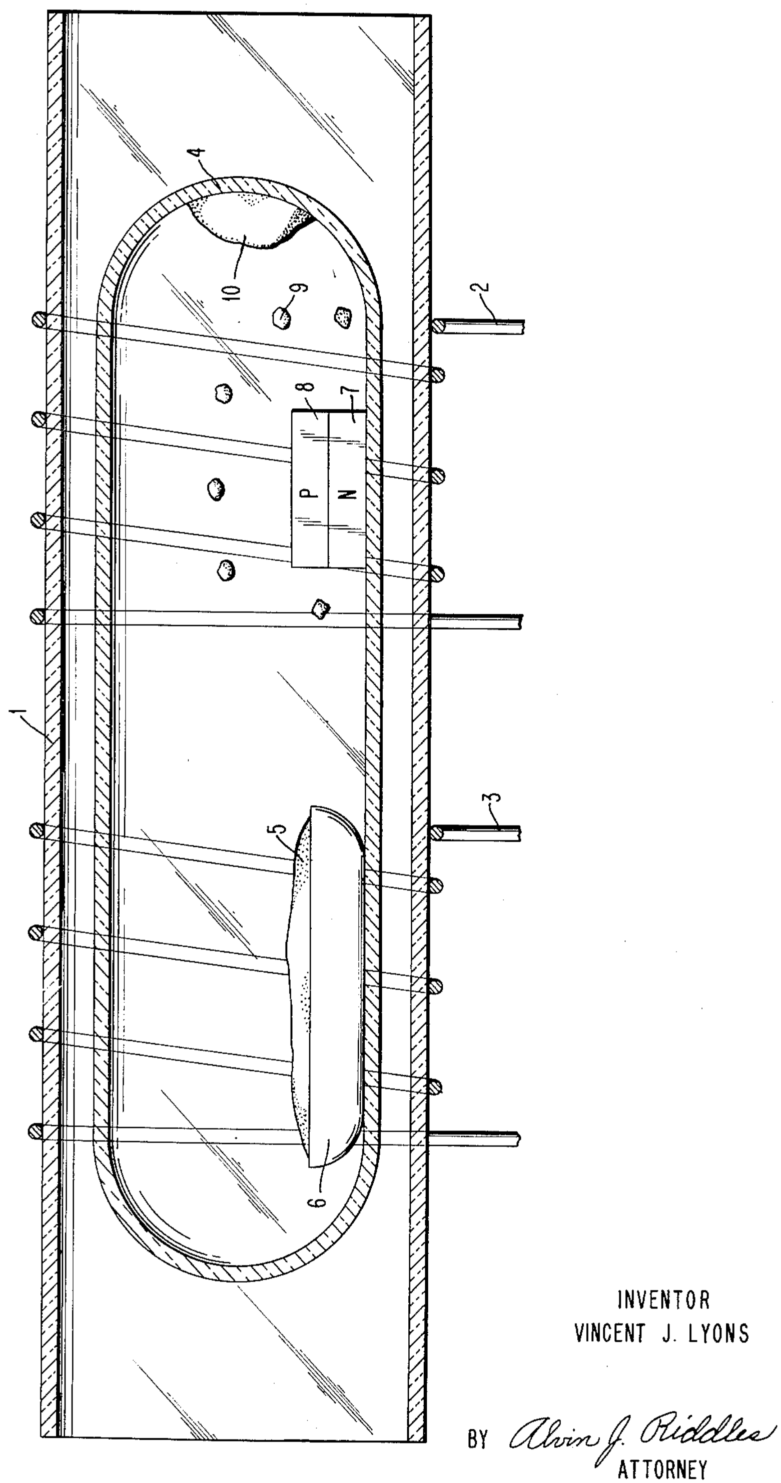
INVENTOR
VINCENT J. LYONS
BY Alvin J. Riddles
ATTORNEY United States Patent Office 3,065,113
Patented Nov. 20, 1962

3,065,113

COMPOUND SEMICONDUCTOR MATERIAL CONTROL

Vincent J. Lyons, Wappingers Falls, N.Y., assignor to International Business Machines Corporation, New York, N.Y., a corporation of New York Filed June 30, 1959, Ser. No. 823,950
3 Claims. (Cl. 117—201)

This invention relates to compound semiconductor materials and in particular to the transportation and deposition of compound semiconductor materials in single crystalline form.

Compound type semiconductor materials generally composed of two elements which in the compound form may be grown as a single crystal, have become useful for semiconductor device manufacture in the art. Since a majority of the compounds first investigated involved metal constituent elements, this class of semiconductor materials received the name of intermetallic compounds.

The compound semiconductors have various advantages such as different energy gap widths, carrier lifetime and performance under wide ranges of temperature conditions. However, in attempting to fabricate semiconductor devices using conventional processes with these compound semiconductors, problems have been encountered due to a tendency of the compound to dissociate or to be incompatible with the various conductivity type determining impurities which must be introduced into portions of the compound in order to give the ultimate device the various characteristics required.

The problems involving dissociation of the compound have been extremely difficult to overcome where the semiconductor device bodies are formed by a technique known as epitaxial deposition, in which a gaseous phase compound of the semiconductor material and a transport element is decomposed to release, in single crystalline form upon a substrate, the desired semiconductor material.

It has been discovered that compound type semiconductor materials can be transported in the gaseous phase and epitaxially deposited on a substrate, or in the alternative, deposited in pure crystalline form, by confining the transportation operation to a single sealed container having one set of physical conditions maintained at the source of the semiconductor material and a second set of physical conditions maintained at the deposition site for the semiconductor material, and wherein at the site of the deposition of the semiconductor material; the compound is maintained in equilibrium with a gas of a more volatile element of the compound.

It is an object of this invention to provide an improved technique of forming bodies of compound semiconductor materials.

It is another object of this invention to provide an improved deposition reaction for compound semiconductor materials.

It is another object of this invention to provide a compound deposition apparatus for semiconductor materials.

It is another object of this invention to provide an improved transportation and deposition apparatus for zinc arsenide ($ZnAs_2$) semiconductor material.

It is another object of this invention to provide an improved transportation and deposition technique for zinc arsenide ($ZnAs_2$) semiconductor material.

It is another object of this invention to provide a method of forming zinc arsenide ($ZnAs_2$) rectifying semiconductor devices.

The foregoing and other objects, features and advantages of the invention will be apparent from the following more particular description of a preferred embodiment of the invention as illustrated in the accompanying drawings.

In the drawings:

The FIGURE is a schematic sketch illustrating the technique of the invention and the apparatus for performing the controlled transportation and deposition of compound semiconductor material.

Referring now to the figure, a schematic sketch is provided of the compound semiconductor material control technique of the invention and the apparatus involved in the practice of the invention. The technique of the invention may be described as the transportation of a compound semiconductor material in the gaseous phase and the deposition of the compound semiconductor material in an environment in which the most volatile element in the compound semiconductor material is maintained at an equilibrium with a concentration of that element in the environment.

In the figure the apparatus for performing the invention comprises a specially constructed furnace made up of a furnace tube 1 which may be of transparent material such as quartz to facilitate watching the various sites of the reaction therein, having at least two separately controlled temperature zones. The individual zones are illustrated in the figure by the fact that a first heating coil 2 connectable to an appropriate power source is shown around one portion of the furnace and a second heating coil 3, connectable to an appropriate power source is shown around another portion of the furnace. A sealed container 4 of quartz, vycor or similar material is positioned within the furnace so that one portion is under the coil 2, and another portion is under the coil 3. The sealed container 4 contains in one site under the coil 3, the compound semiconductor material in an appropriate container such as a graphite boat. The compound semiconductor material has been labelled element 5, and the boat has been labelled element 6.

In the second site in the furnace under the coil 2, a monocrystalline substrate 7 of semiconductor material upon which the transported compound is to be deposited, is positioned and an epitaxial deposit of the compound is shown as element 8. The substrate 7 and deposit 8 elements have been given N and P conductivity types respectively to indicate the formation of PN junction type semiconductor materials by the technique of the invention. In addition, single free crystals 9 of the transported compound semiconductor are shown on the walls of the container 4. In accordance with the invention, a means is provided for maintaining an equilibrium pressure of the more volatile element of the compound semiconductor material. This means is shown as a quantity of the more volatile element positioned in the vicinity of the site of the deposition and labelled element 10.

In operation, appropriate power is supplied to coils 2 and 3 of the furnace such that the compound semiconductor material 5 is brought up to the temperature sufficient to liquefy and vaporize. In the deposition site under the coil 2, the temperature is raised to a point governed by the quantity of the material 10 and the size of the tube 4, such that an equilibrium is established between the vaporized element 10 and the semiconductor material being transported.

With the difference in temperature established, a non-equilibrium exists under the coil 3 such that the compound semiconductor material combines with the additional quantity of the more volatile element in the compound which serves as a transport element in the sealed tube and this compound upon entering the region under the coil 2, wherein an equilibrium is established with the supplied volatile element 10, the compound semiconductor material is deposited on the walls of the tube and/or an appropriate substrate, either in the form of pure crystals 9 or as an epitaxial deposition 8 on a substrate 7. The deposited semiconductor material may, due to the selective introduction of conductivity type determining impurities, form semiconductor structures such as the rectifying device shown comprising elements 7 and 8 wherein the substrate 7 was of N conductivity type and the epitaxially deposited material 8 is of a P conductivity type.

It will be apparent at this point that many of the aspects of the technology of transport and deposition type reactions known in the art may be employed here to effect appropriate introduction of conductivity type determining impurities so as to fabricate desired structures with various configurations of conductivity type zones and resistivities therein. It has been found that the quantity of conductivity type determining impurities sufficient to control the ultimate device performance involved in semiconductor structures in accordance with this invention, generally on the order of 0.001 percent, is sufficiently small so as not to interfere appreciably with the transportation and deposition reaction. Hence, a substantial amount of freedom is available when practicing the invention in the inclusion of conductivity type determining impurities either in the source 5, or through controlled vaporization of other free sources of conductivity type determining impurities in the container 4.

For purposes of practicing the invention, it is important only that a difference in temperature be established in a sealed container wherein at one temperature site an equilibrium is established between a free source of the more volatile element of a compound semiconductor material is formed and in another site of the sealed container, a source of the compound semiconductor material is maintained at a temperature away from the equilibrium condition.

In order to aid in understanding and practicing the invention, the following set of specifications for a particular type of semiconductor material is provided, it being understood that no limitation should be construed thereby for in the light of the invention many sets of particular specifications may be provided by one skilled in the art.

The following set of specifications is for the compound semiconductor material zinc arsenide ($ZnAs_2$).

The compound zinc arsenide is of the two-five class of intermetallic compounds. It has been found that when this compound is heated under conditions sufficient for transportation and deposition, the compound itself, the $ZnAs_2$ tends to decompose to what is known as the three-two form of zinc arsenide ($Zn_3As_2$) plus arsenic. In order to prevent this decomposition, it is necessary to maintain the compound in equilibrium with vaporized arsenic at the site of the deposition. The pressure of the vapor being determined from the temperature of the zinc arsenide, $ZnAs_2$. The conditions under which deposition of $ZnAs_2$ from a vapor phase occurs are described below in connection with the figure.

The composition of the material 5 in the boat 6 is near that of stoichiometric $ZnAs_2$ containing quantities, on the order of 0.00004 percent of P conductivity type determining impurities. The temperature of the material 5 is adjusted by the power applied to the coil 3, and established at a temperature between 770° and 900° C. At this temperature the material in the boat 6, that is element 5, quite likely departs from the stoichiometric $ZnAs_2$ and is considered to be a mixture of $ZnAs_2$ and $Zn_3As_2$.

In the deposition site of the furnace, under the coil 2, the temperature is established for condensation purposes between 720° and 740° C. The size of the tube 4 is 100 cubic centimeters in volume. The quantity of the volatile compound element 10 which in this illustration is arsenic is such that when the conditions of material transport are maintained, there will always be solid arsenic in equilibrium with the gas phase. Under the above conditions an epitaxial deposition of P type semiconductor zinc arsenide ($ZnAs_2$) occurs on a substrate of N conductivity type shown as element 7, at a rate of 10 to 15 microns an hour and forms a PN junction thereon. The arsenic pressure in the zone under coil 2 must be high enough to prevent decomposition of the condensed and deposited zinc arsenide ($ZnAs_2$) crystals such as 9 or the epitaxial deposition 8 and, at the same time, be such that a condition exists at the melt 5 where there is less arsenic in the surrounding environment than the environment can absorb at the particular temperature. In other words, a non-equilibrium condition exists.

What has been described is a technique whereby thermally unstable compound semiconductor compounds may be transported in a gaseous phase and may be condensed as a stoichiometric compound through the use of a sealed container, two separate heating sources for separate sites in the container and, the controlled vaporization of a supply of the more volatile element of the compound.

While the invention has been particularly shown and described with reference to a preferred embodiment thereof, it will be understood by those skilled in the art, that changes in form and details may be made therein without departing from the scope and spirit of the invention.

For example, such changes might include a plurality of opposite conductivity semiconductor sources such as illustrated by 5 in the figure which may be made to vaporize and deposit in the deposition site by variations of temperature in individual zones in the sealed container.

What is claimed is:

1. The method of transporting and depositing two element compound type semiconductor materials which are subject to thermal dissociation comprising: maintaining in a sealed container a source of a particular two element compound type semiconductor material at a vaporization temperature at less than equilibrium pressure conditions with the more volatile constituent of said compound type semiconductor material in a first location, maintaining in a second location in said sealed container an equilibrium pressure condition of said more volatile constituent of said compound type semiconductor material and depositing monocrystalline compound type semiconductor material in said second region by maintaining a temperature in said second location sufficient to effect deposition.

2. The method of transporting and depositing two element compound type semiconductor materials which are subject to thermal dissociation comprising: maintaining in a sealed container a source of a particular two element compound type semiconductor material at a vaporization temperature at less than equilibrium pressure conditions with the more volatile constituent of said compound type semiconductor material in a first location, maintaining in a second location in said sealed container an equilibrium pressure condition of said more volatile constituent of said compound type semiconductor material and epitaxially depositing monocrystalline compound type semiconductor material on a suitable substrate in said second region of said sealed container by establishing a temperature in said second region lower than said melting point at equilibrium pressure in the presence of a quantity of said more volatile constituent of said compound type semiconductor material.

3. The technique of forming zinc arsenide ($ZnAs_2$) semiconductor bodies comprising: providing a sealed container having a volume of 100 cubic centimeters, placing 50 grams of ($ZnAs_2$) semiconductor material in a first zone in said container, placing 50 grams of arsenic in the vicinity of a second zone of said container, establishing a temperature in the range of 700° to 900° centigrade in said first zone of said container, depositing monocrystalline zinc arsenide ($ZnAs_2$) semiconductor material in said second zone of said container by establishing a temperature of 720° C. to 740° C. in said second zone of said container and maintaining a portion of said arsenic in solid form in equilibrium with a vapor in said container while maintaining the described conditions for a period of 24 hours time.

References Cited in the file of this patent

UNITED STATES PATENTS

| | | |
|---|---|---|
| 2,849,343 | Kroger et al. | Aug. 26, 1958 |
| 2,873,222 | Derick et al. | Feb. 10, 1959 |
| 2,879,190 | Logan et al. | Mar. 24, 1959 |
| 2,898,248 | Silvey et al. | Aug. 4, 1959 |
| 2,900,286 | Goldstein | Aug. 18, 1959 |
| 2,928,761 | Gremmelmaier et al. | Mar. 15, 1960 |
| 2,933,384 | Welker et al. | Apr. 19, 1960 |

FOREIGN PATENTS

| | | |
|---|---|---|
| 207,531 | Australia | Apr. 23, 1957 |
| 1,163,905 | France | May 5, 1958 |